United States Patent
Choi et al.

(10) Patent No.: US 10,267,867 B2
(45) Date of Patent: Apr. 23, 2019

(54) SIGNAL TRANSMISSION/RECEPTION METHOD FOR SIGNAL ANALYSIS IN FMMD TECHNOLOGY AND APPARATUS USING THE SAME

(71) Applicant: ELECTRONICS AND TELECOMMUNICATIONS RESEARCH INSTITUTE, Daejeon (KR)

(72) Inventors: Seung-Min Choi, Daejeon (KR); Jae-Chan Jeong, Daejeon (KR); Hyo-Bong Hong, Daejeon (KR); Sung-Woong Shin, Daejeon (KR); Jae-Il Cho, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 9 days.

(21) Appl. No.: 15/657,367

(22) Filed: Jul. 24, 2017

(65) Prior Publication Data

US 2018/0100901 A1    Apr. 12, 2018

(30) Foreign Application Priority Data

Oct. 12, 2016   (KR) .......................... 10-2016-0132004

(51) Int. Cl.
 *G01R 33/02*    (2006.01)
 *G01R 33/00*    (2006.01)
 (Continued)

(52) U.S. Cl.
 CPC ..... *G01R 33/0023* (2013.01); *G01R 33/0029* (2013.01); *G01R 33/12* (2013.01);
 (Continued)

(58) Field of Classification Search
 CPC .......................... G01R 33/0023; G01R 33/0029
 (Continued)

(56) References Cited

U.S. PATENT DOCUMENTS

| 4,106,096 A | 8/1978 | Paoli |
| 9,714,990 B2 | 7/2017 | Hong et al. |

(Continued)

FOREIGN PATENT DOCUMENTS

| JP | 2007-64751 | 3/2007 |
| KR | 10-2014-0038286 | 3/2014 |
| KR | 10-2014-0113385 | 9/2014 |

OTHER PUBLICATIONS

H.B. Hong et al., "Development of Next Medical Imaging System beyond MRI", Electronics and Telecommunications Trends, 2014; pp. 96-104.

(Continued)

*Primary Examiner* — Reena Aurora
(74) *Attorney, Agent, or Firm* — Kile Park Reed & Houtteman PLLC

(57) ABSTRACT

Disclosed herein are a signal transmission/reception method for signal analysis in FMMD technology and an apparatus using the method. A signal transmission apparatus includes a signal generation unit for generating two sine wave signals having different frequencies in consideration of a voltage of an excitation coil included in a magnetic particle measurement sensor, a signal addition unit for generating an input signal for producing a magnetic field by electronically adding the two sine wave signals, a differential signal generation unit for generating a differential signal for the input signal to minimize transmission noise, and a signal transmission unit for amplifying voltages of the input signal and the differential signal and transmitting the amplified input signal and differential signal to the excitation coil so as (Continued)

to produce a magnetic field in the excitation coil and apply the magnetic field to a measurement target sample.

20 Claims, 7 Drawing Sheets

(51) Int. Cl.
*G01R 33/12* (2006.01)
*G01R 33/32* (2006.01)
*G01R 33/34* (2006.01)
*G06F 11/14* (2006.01)

(52) U.S. Cl.
CPC ........ *G01R 33/32* (2013.01); *G01R 33/34053* (2013.01); *G06F 11/1443* (2013.01)

(58) Field of Classification Search
USPC ........................................................ 324/202
See application file for complete search history.

(56) References Cited

U.S. PATENT DOCUMENTS

| | | | |
|---|---|---|---|
| 2004/0056652 A1* | 3/2004 | Bomya | B60R 21/0136 324/207.17 |
| 2007/0155024 A1 | 7/2007 | Miethe et al. | |
| 2009/0155932 A1 | 6/2009 | Suh et al. | |
| 2009/0278534 A1* | 11/2009 | Kahlman | B82Y 25/00 324/252 |
| 2010/0033178 A1 | 2/2010 | Lee et al. | |
| 2011/0260726 A1* | 10/2011 | Techavipoo | G01R 33/246 324/309 |
| 2014/0097829 A1 | 4/2014 | Wang et al. | |

OTHER PUBLICATIONS

Hans-Joachim Krause et al., "Magnetic particle detection by frequency mixing for immunoassay applications", Journal of Magnetism and Magnetic Materials, 311, 2007, pp. 436-444.

* cited by examiner

SIGNAL TRANSMISSION/RECEPTION METHOD FOR SIGNAL ANALYSIS IN FMMD TECHNOLOGY AND APPARATUS USING THE SAME

CROSS REFERENCE TO RELATED APPLICATION

This application claims the benefit of Korean Patent Application No. 10-2016-0132004, filed Oct. 12, 2016, which is hereby incorporated by reference in its entirety into this application.

BACKGROUND OF THE INVENTION

1. Technical Field

The present invention relates generally to technology for transmitting and receiving signals to perform signal analysis in Frequency Mixing Magnetic Detection (FMMD) technology and, more particularly, to a signal transmission/reception method for signal analysis in FMMD technology and an apparatus using the method, which can precisely analyze a wide variety of types of materials by adding various setting functions to a signal transmission stage and a signal reception stage.

2. Description of the Related Art

Among pieces of medical imaging equipment based on magnetic properties, the field technically closest to a successor to a Magnetic Resonance Imaging (MRI) system is a Magnetic Particle Imaging (MPI) system. The physical principles of MPI technology that has been developed to date are considerably different from those of existing MRI. In practice, MPI itself has the meaning of a magnetic particle analysis imaging system, but this technology may be applied to a wide variety of fields without being limited to particles.

The first theory used in MPI technology is based on the Langevin equation proposed by the French scientist Paul Langevin. Actually, the Langevin equation theory was proposed to describe Brownian motion, and Langevin would never have imagined that this theory could be used to acquire medical images. A general idea of MPI is based on two types of physical properties, one of which is that a specific magnetic material has nonlinear magnetic properties. Most substances constituting a human body and carbon-based compounds are diamagnetic materials, which are slightly repelled by a magnetic field, rather than magnetic materials. Further, when magnetized, a magnetic material such as iron tends to have magnetic force for a predetermined period of time. However, in the case of a superparamagnetic material, when the size thereof is reduced to a predetermined size (typically, 50 nm to 100 nm) or less, the superparamagnetic material has magnetism only when a magnet is nearby. In this case, the superparamagnetic material has nonlinear magnetic properties.

The other physical property is that, in a Maxwell magnet, a Field Free Point (FFP) or a Field Free Line (FFL) occurs. However, a lot of time was required in order to actually apply this concept to medical imaging equipment. The basic physical concepts were proposed in the early 20th century. However, the actual application of the physical concepts to medical imaging was initially attempted by scientists in the Royal Philips Research Laboratory (Lab) in Hamburg, Germany in 2001, and the results of research having been conducted by them were gathered and published in Nature in 2005, and thus such physical properties attracted global attention.

In accordance with the results of research conducted to date, there is an advantage in that, when MPI is used, an image having a high resolution that cannot be normally achieved by existing MRI, for example, a 0.4 cm resolution, can be acquired, and in that when FFP and FFL are electromagnetically moved, images can be acquired within a period of several tens of milliseconds (ms). Further, there is an advantage in that, when various kinds of antigens and antibodies are combined with magnetic particles that are used as a contrast medium, similar results that are nonradiological and that can be acquired from Positron Emission Tomography (PET) may be obtained.

Then, the Krause team from Germany proposed and implemented a measurement structure corresponding to the basic concept of FMMD implementation through the paper "Magnetic particle detection by frequency mixing for immunoassay applications" in 2007, and succeeded in experiments. In connection with this, U.S. Patent Application Publication No. 2007-0155024 (Date of Publication: Jul. 5, 2007) discloses a technology related to "Method and Device for Selectively Detecting Ferromagnetic or Superparamagnetic Particles."

SUMMARY OF THE INVENTION

Accordingly, the present invention has been made keeping in mind the above problems occurring in the prior art, and an object of the present invention is to enable a wide variety of types of materials to be measured when FMMD for measuring the nonlinear degree of a nonlinear material located in an applied magnetic field is implemented.

Another object of the present invention is to enable the provision of a high Signal-to-Noise Ratio (SNR) and the analysis of various frequency bands to be simultaneously performed, compared to an analog lock-in method, through digital signal processing configuration when FMMD for measuring the nonlinear degree of a nonlinear material located in an applied magnetic field is implemented.

In accordance with an aspect of the present invention to accomplish the above objects, there is provided a signal transmission apparatus in a module for signal analysis in FMMD technology, including a signal generation unit for generating two sine wave signals having different frequencies in consideration of a voltage of an excitation coil included in a magnetic particle measurement sensor; a signal addition unit for generating an input signal for producing a magnetic field by electronically adding the two sine wave signals; a differential signal generation unit for generating a differential signal for the input signal to minimize transmission noise; and a signal transmission unit for amplifying voltages of the input signal and the differential signal and transmitting the amplified input signal and differential signal to the excitation coil so as to produce a magnetic field in the excitation coil and apply the magnetic field to a measurement target sample.

The signal addition unit may be configured to, when each of the two sine wave signals is transmitted to a respective one excitation coil, add only offset signals corresponding to the two sine wave signals, and when the two sine wave signals are transmitted to a single excitation coil, add and combine the two sine wave signals.

The signal transmission unit may measure respective current values of the input signal and the differential signal, and control transmission of the input signal and the differential signal in consideration of a magnetic flux density of the excitation coil, which is measured based on the current values.

The signal transmission unit may amplify voltages of the input signal and the differential signal using at least one of a single amplifier and a parallel amplifier.

The signal generation unit may include a filter unit for cancelling noise from the two sine wave signals using an analog element corresponding to at least one of active and passive elements; and a voltage control unit for amplifying voltages corresponding to the two sine wave signals, which have decreased due to cancellation of noise, to values required by the excitation coil.

The voltage control unit may amplify the voltages corresponding to the two sine wave signals by setting values of the voltages to the values required by the excitation coil using an additional program.

The signal transmission apparatus may further include an offset signal control unit for controlling the offset signals.

In accordance with another aspect of the present invention to accomplish the above objects, there is provided a signal reception apparatus in a module for signal analysis in FMMD technology, including a signal reception unit for receiving a detection signal, induced by a measurement target sample, from a detection coil included in a magnetic particle measurement sensor; a signal conversion unit for converting an input signal and the detection signal that produce a magnetic field excited in the measurement target sample into respective digital signals by time-synchronizing the input signal with the detection signal; a noise cancellation unit for converting the digital signals into signals in a frequency domain and eliminating signals falling out of a band of interest from the frequency domain; and a signal analysis unit for outputting result values of signal analysis based on a frequency corresponding to the input signal and a frequency corresponding to the detection signal in the band of interest.

The signal conversion unit may include a filter unit for cancelling noise from the detection signal using an analog element corresponding to at least one of active and passive elements; and a voltage control unit for linearly amplifying a voltage of the detection signal to correspond to an input range of an Analog-to-Digital Converter (ADC) using an additional program.

The signal conversion unit may be configured to receive the input signal from a sine wave signal generator, which transmits a signal to an excitation coil of the magnetic particle measurement sensor, and to convert a low-frequency signal and a high-frequency signal corresponding to the input signal into digital signals, simultaneously with conversion of the detection signal, using a multi-channel ADC.

The noise cancellation unit may convert the digital signals into signals in a frequency domain using a Fast Fourier Transform (FFT) technique.

The noise cancellation unit may eliminate signals falling out of the band of interest from the digital signals using a digital element.

The signal analysis unit may measure a magnitude of the frequency corresponding to the detection signal and an input signal versus phase delay in the band of interest, and outputs the frequency magnitude and the input signal versus phase delay as the result values.

In accordance with a further aspect of the present invention to accomplish the above objects, there is provided a signal transmission/reception method for signal analysis in FMMD technology, the method being performed by a module for signal analysis in FMMD technology, the method including generating, by a signal transmission apparatus, two sine wave signals having different frequencies in consideration of a voltage of an excitation coil included in a magnetic particle measurement sensor; generating, by the signal transmission apparatus, an input signal for producing a magnetic field in the excitation coil by electronically adding the two sine wave signals, generating a differential signal for the input signal, and transmitting the differential signal, together with the input signal, to the excitation coil; receiving, by a signal reception apparatus, a detection signal, induced by a measurement target sample, from a detection coil included in the magnetic particle measurement sensor; and converting, by the signal reception apparatus, the detection signal and the input signal into respective digital signals by time-synchronizing the detection signal with the input signal, analyzing frequencies falling within a band of interest from a frequency domain of the digital signals, and outputting analysis results as result values.

Transmitting the differential signal together with the input signal may include when each of the two sine wave signals is transmitted to a respective one excitation coil, generating the input signal by adding only offset signals corresponding to the two sine wave signals; and when the two sine wave signals are transmitted to a single excitation coil, generating the input signal by adding and combining the two sine wave signals.

Transmitting the differential signal together with the input signal may be configured to measure respective current values of the input signal and the differential signal and to control transmission of the input signal and the differential signal in consideration of a magnetic flux density of the excitation coil, which is measured based on the current values.

Transmitting the differential signal together with the input signal may include amplifying voltages of the input signal and the differential signal using at least one of a single amplifier and a parallel amplifier.

Receiving the detection signal may include cancelling noise from the detection signal using an analog element corresponding to at least one of the active and passive elements; and linearly amplifying a voltage of the detection signal to correspond to an input range of an Analog-to-Digital Converter (ADC) using an additional program.

Outputting the analysis results as the result values may include receiving the input signal from a sine wave signal generator; and converting a low-frequency signal and a high-frequency signal corresponding to the input signal into digital signals, simultaneously with conversion of the detection signal, using a multi-channel ADC.

Converting the low-frequency signal and the high-frequency signal may include converting the digital signals into signals in a frequency domain using a Fast Fourier Transform (FFT) technique; and eliminating signals falling out of the band of interest from the digital signals using a digital element.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
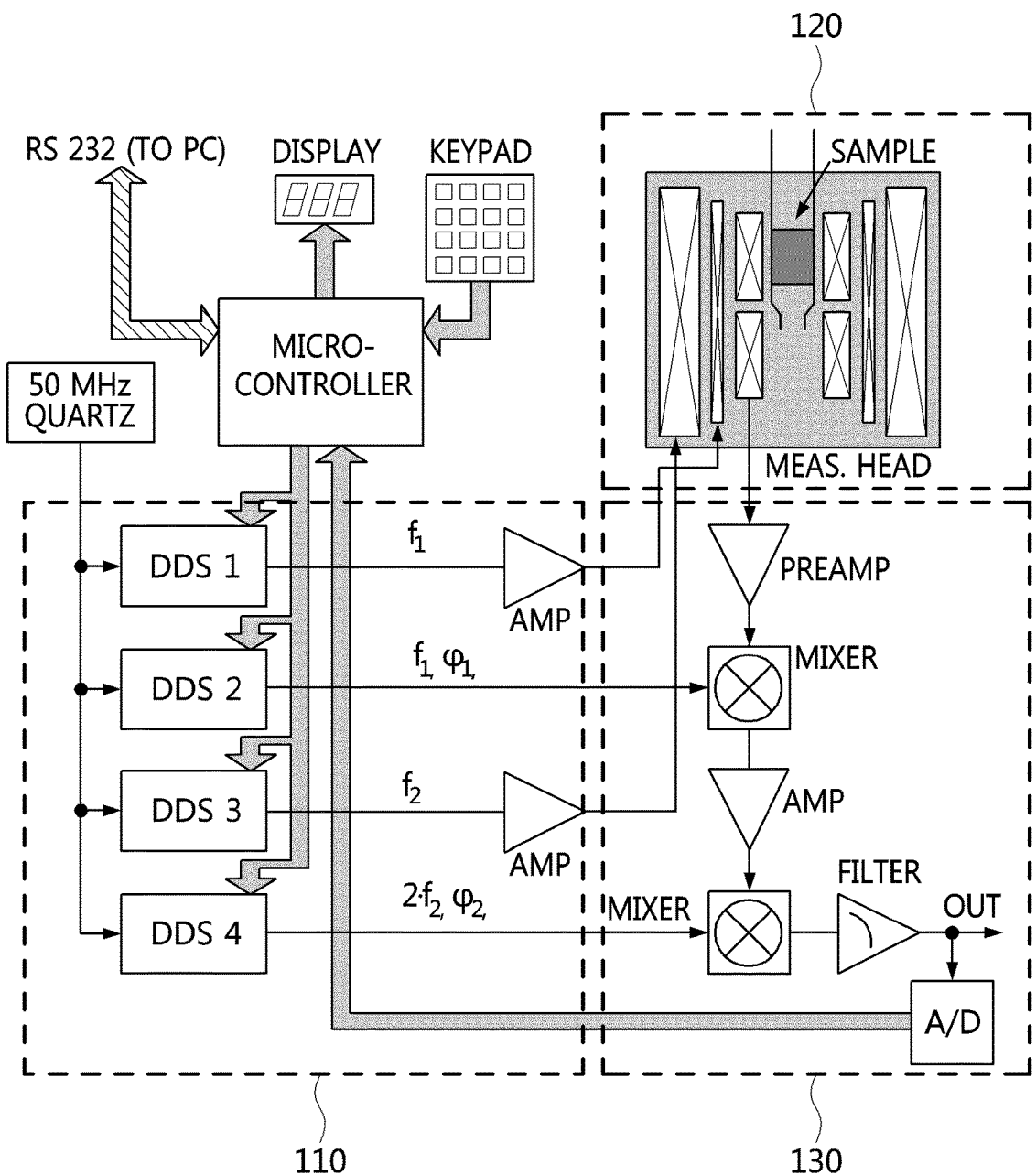
FIG. 1 is a diagram illustrating a measurement structure corresponding to the basic concept of FMMD implementation.

The present invention will be described in detail below with reference to the accompanying drawings. Repeated descriptions and descriptions of known functions and configurations which have been deemed to make the gist of the present invention unnecessarily obscure will be omitted below. The embodiments of the present invention are intended to fully describe the present invention to a person having ordinary knowledge in the art to which the present invention pertains. Accordingly, the shapes, sizes, etc. of components in the drawings may be exaggerated to make the description clearer.

Hereinafter, preferred embodiments of the present invention will be described in detail with reference to the attached drawings.

FIG. 1 is a diagram illustrating a measurement structure corresponding to the basic concept of FMMD implementation.

Referring to FIG. 1, the measurement structure corresponding to the basic concept of FMMD implementation may be chiefly divided into a signal transmission stage 110, a signal measurement stage 120, and a signal reception stage 130.

The signal transmission stage 110 may function to generate signals having two types of frequencies, amplify the generated signals, and transmit the amplified signals to the excitation coil of the signal measurement stage 120.

The signal measurement stage 120 may be implemented in the form of a sensor composed of the excitation coil and a detection coil.

Here, the signals transferred from the signal transmission stage 110 may be applied to the excitation coil, and may induce a magnetic field in a sample that can be located inside or outside the excitation coil.

Meanwhile, the detection coil may detect signals electromagnetically induced by a magnetic field, which is applied from the excitation coil, and signal, which is generated by the sample having paramagnetic or superparamagnetic properties, and may transfer the electromagnetically induced signals to the signal reception stage 130.

The signal reception stage 130 may receive the induced signals from the excitation coil and the sample, respectively, amplify the received respective signals, measure the intensities of the amplified signals at frequencies desired to be analyzed, and output the measured signal intensities to an Analog-to-Digital Converter (ADC).

A finally measured value in FMMD having this structure may be the value of the ADC, output from the signal reception stage 130.

Here, more precise measurement may be realized when the measurement is performed in the state in which the Signal-to-Noise Ratio (SNR) of the ADC value is high and the magnetization property of the sample is taken into consideration.

Here, the measurement structure shown in FIG. 1 is a structure proposed by the Krause team from Germany through the paper "Magnetic particle detection by frequency mixing for immunoassay applications" in 2007.

The present invention is intended to propose a signal transmission/reception method that can easily measure various types of materials using a wide variety of setting functions and can provide more improved SNR, compared to existing methods, in a signal analysis method in FMMD technology based on the measurement structure shown in FIG. 1.

That is, the present invention is intended to provide a method that can control both the frequency of a signal to be transmitted and a supply current depending on the magnetization property of a measurement target sample when the signal transmission stage 110 shown in FIG. 1 is configured.

Further, the present invention is intended to provide a method that can perform frequency analysis using a Fast Fourier Transform (FFT) technique so that, when the signal reception stage 130 shown in FIG. 1 is configured, various frequencies are selectively separated from a signal detected from the measurement target sample.

Figure 2:
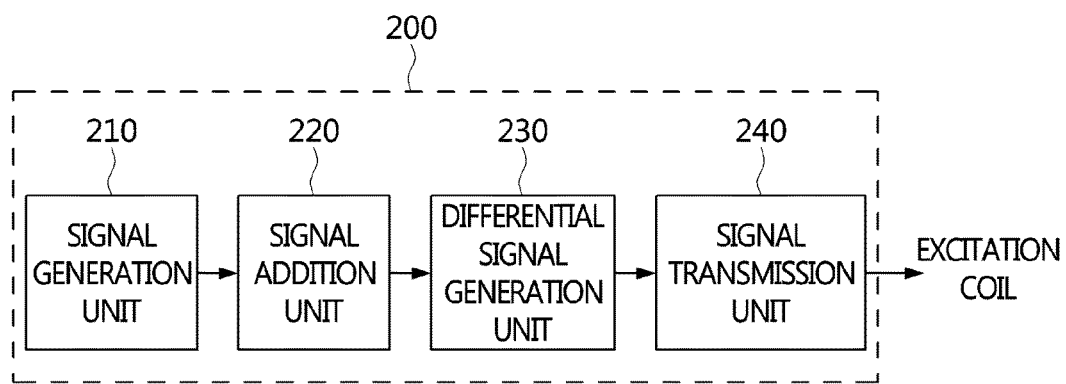
FIG. 2 is a block diagram illustrating a signal transmission apparatus according to an embodiment of the present invention.

FIG. 2 is a block diagram illustrating a signal transmission apparatus according to an embodiment of the present invention.

Referring to FIG. 2, a signal transmission apparatus 200 according to the embodiment of the present invention includes a signal generation unit 210, a signal addition unit 220, a differential signal generation unit 230, and a signal transmission unit 240.

In a module for signal analysis in Frequency Mixing Magnetic Detection (FMMD) technology, the signal generation unit 210 generates two sine wave signals having different frequencies in consideration of the voltage of an excitation coil included in a magnetic particle measurement sensor.

Here, the module for signal analysis in FMMD technology may be composed of a transmission stage, a measurement stage, and a reception stage, as in the case of the measurement structure shown in FIG. 1, and the signal transmission apparatus shown in FIG. 2 may be a device corresponding to the transmission stage of the measurement structure.

The two sine wave signals may be generated by a sine wave signal generator. Here, respective frequencies corresponding to the two sine wave signals may be selected by a user.

Here, the two sine wave signals may correspond to signals generated based on a fundamental frequency. Here, the fundamental frequency may be represented by a sine function, and may be a fundamental waveform used to represent spatial frequencies or sounds. Further, the two sine wave signals may correspond to one high-frequency signal and one low-frequency signal.

The noise in the two sine wave signals may be cancelled by an analog element corresponding to at least one of active and passive elements. For example, noise may be cancelled in such a way as to cause the signals generated by the sine wave signal generator to pass through a filter that includes the analog element corresponding to at least one of active and passive elements.

The voltages corresponding to the two sine wave signals, which have decreased due to the cancellation of noise, may be amplified to values required by the excitation coil.

In this case, the values of voltages corresponding to the two sine wave signals may be set to values required by the excitation coil using an additional program, and thus the voltage values may be amplified to the set values.

An additional amplifier is provided previous to an amplifier for controlling the values of voltages using the additional program, so that signals may be amplified and then input in accordance with the setting characteristics of the amplifier that enables the setting of gain through the program.

For example, assuming that an amplifier for controlling the values of voltages using the additional program is a first amplifier, a second amplifier is additionally provided between a filter for cancelling noise and the first amplifier, so that signals to be input to the first amplifier may be amplified in accordance with the setting characteristics of the first amplifier.

The signal addition unit 220 generates an input signal for producing a magnetic field by electronically adding the two sine wave signals.

In an example, when two excitation coils are used, magnetic fields are produced by respective excitation coils, but a procedure for calibrating the two excitation coils may be included so as to produce the combined magnetic field suitable for the measurement of magnetic particles.

In another example, when a single excitation coil is used, two signals are combined in advance and the combined signal is excited in the excitation coil, thus enabling a magnetic field to be produced by the combined signal in the single excitation coil. That is, in this case, there is an advantage in that the expense for a single excitation coil and expense for calibration are reduced.

Here, when each of two sine wave signals is transmitted to a respective one excitation coil, only offset signals corresponding to the two sine wave signals are added, whereas when two sine wave signals are transmitted to a single excitation coil, the two sine wave signals may be added and then combined.

Here, "offset signal" may mean an offset voltage, which may correspond to a voltage to be applied to an input terminal so that an output is adjusted to zero when the output occurs even if the signal of an input circuit is zero.

That is, when each of the two sine wave signals is transmitted to a respective one excitation coil, offset voltages corresponding to the two sine wave signals may be added and may be applied to an input signal generated by the two sine wave signals.

Here, the two sine wave signals may be added and combined using a combiner that adds and combines two signals. That is, the combiner may be a passive electronic element for adding and combining two signals.

For example, the combiner may correspond to any one of a Radio Frequency (RF) combiner, which corresponds to the characteristics of the input signal, an addition amplifier, and electronic equipment that enables an addition operation of analog signals. Here, which type of equipment is to be used may be selectively determined by a user and a manager who implement FMMD technology.

Here, the combiner may be a concept including not only existing electronic equipment such as an RF combiner or an addition amplifier, which is conventionally used, but also electronic equipment that can be developed in the future and enables an addition operation of analog signals.

Here, the two sine wave signals may be added and combined, and thus the two signals may be combined without mutually influencing each other.

The procedure for adding and combining two sine wave signals may be performed such that the signals are combined in conformity with a ratio adjusted by the foregoing amplifier that controls the values of voltages using an additional program.

Further, although not shown in FIG. 2, the signal transmission apparatus according to an embodiment of the present invention may control the offset signals corresponding to two sine wave signals.

For example, the offset voltage may be controlled by generating a positive (+) or negative (−) DC signal and adding the DC signal to the offset voltage.

The differential signal generation unit 230 generates a differential signal for the input signal so as to minimize transmission noise.

Here, the differential signal may mean a signal that is phase-inverted with respect to the input signal. Here, during signal transmission, noise occurring in the input signal and noise occurring in the differential signal cancel each other out, and thus signal deformation attributable to noise may be minimized after the input signal has been transmitted.

The signal transmission unit 240 may amplify the voltages of the input signal and the differential signal and transmit the amplified signals to the excitation coil in order to produce a magnetic field in the excitation coil and apply the magnetic field to a measurement target sample.

Here, respective current values of the input signal and the differential signal may be measured, and the transmission of the input signal and the differential signal may be controlled in consideration of the magnetic flux density of the excitation coil measured based on the current values.

Since the internal or external magnetic flux density of the excitation coil may be implemented by the product of current and magnetic flux per unit current, a procedure for measuring the current values may be essentially required to suitably control the magnetic flux density.

In particular, the relationship between the current, the impedance of the excitation coil, and the ultimate output voltage may follow Ohm's law, and the magnetic flux per current may be related only to the geometry of the excitation coil. Therefore, it is more convenient to separately control the current and the magnetic flux per current in order to control the magnetic flux density of the excitation coil.

The voltages of the input signal and the differential signal may be amplified using at least one of a single amplifier and a parallel amplifier.

Here, if it is determined that the supply of current to the single amplifier is not desirably performed based on a current value, the voltages may be amplified using the parallel amplifier.

For example, voltage-amplified signals may be primarily transmitted using the single amplifier, and the voltages may be secondarily amplified using the parallel amplifier in which power amplifiers are inserted in parallel, depending on the results of measurement of the current value.

Figure 3:
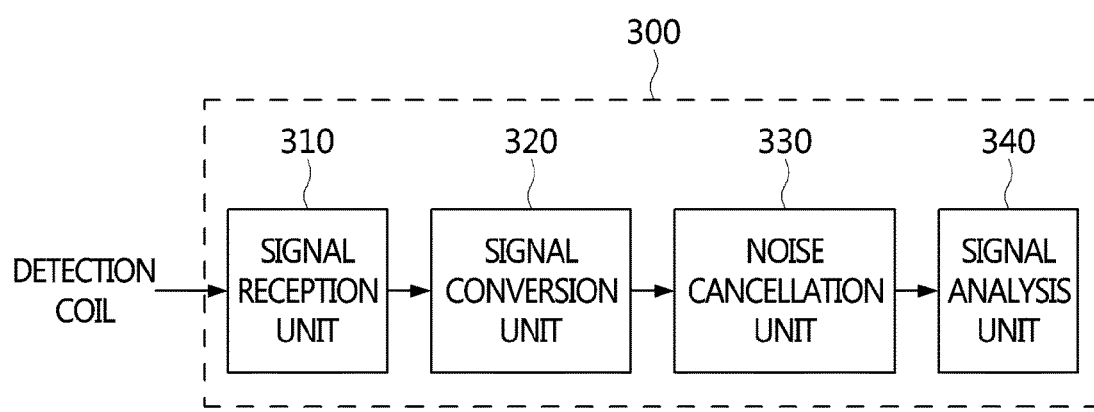
FIG. 3 is a block diagram illustrating a signal reception apparatus according to an embodiment of the present invention.

FIG. 3 is a block diagram illustrating a signal reception apparatus according to an embodiment of the present invention.

Referring to FIG. 3, a signal reception apparatus 300 according to an embodiment of the present invention includes a signal reception unit 310, a signal conversion unit 320, a noise cancellation unit 330, and a signal analysis unit 340.

In a module for signal analysis in Frequency Mixing Magnetic Detection (FMMD) technology, the signal reception unit 310 receives a detection signal, which is induced by a measurement target sample, from a detection coil included in a magnetic particle measurement sensor.

Here, the module for signal analysis in FMMD technology may be composed of a transmission stage, a measurement stage, and a reception stage, as in the case of the measurement structure shown in FIG. 1, and the signal reception apparatus shown in FIG. 3 may be an apparatus corresponding to the reception stage of the measurement structure.

Here, the detection signal may correspond to a signal in which the combined magnetic field produced by the magnetic particle measurement sensor is deformed by the measurement target sample and is input to the detection coil.

Here, the combined magnetic field may be generated by combining two magnetic fields respectively produced by two sine wave signals corresponding to the input signal.

The signal conversion unit 320 may convert the input signal and the detection signal, which produce the magnetic field excited in the measurement target sample, into respective digital signals by time-synchronizing the input signal with the detection signal.

Here, the noise in the detection signal may be cancelled using an analog element corresponding to at least one of active and passive elements. For example, noise may be cancelled by causing the detection signal to pass through a filter that includes the analog element corresponding to at least one of active and passive elements.

Here, only the signal falling within a band of interest may be maintained by cancelling noise from the detection signal.

The intensity of the detection signal may be linearly amplified using an additional amplifier before the detection signal, received from the detection coil, passes through the filter, depending on the intensity of the detection signal input to the filter or the setting of the filter.

Here, the voltage of the detection signal may be linearly amplified to correspond to the input range of an ADC using an additional program. Since the detection signal from the detection coil may be received at different signal intensities for respective materials corresponding to the measurement target sample, the gain of the detection signal may be controlled by the amplifier that uses the program.

In this case, an additional amplifier is provided previous to an amplifier for controlling the values of voltages using the additional program, so that signals may be amplified and then input in accordance with the setting characteristics of the amplifier that enables the setting of gain through the program.

For example, assuming that an amplifier for controlling the values of voltages using the additional program is a first amplifier, a second amplifier is additionally provided between a filter for cancelling noise and the first amplifier, so that signals to be input to the first amplifier may be amplified in accordance with the setting characteristics of the first amplifier.

Here, the input signal may be received from a sine wave signal generator that transmits a signal to the excitation coil of the magnetic particle measurement sensor, and a low-frequency signal and a high-frequency signal corresponding to the input signal may be converted into digital signals using a multi-channel ADC, simultaneously with the conversion of the detection signal. Here, low-frequency and high-frequency channels may be time-synchronized, and the low-frequency and high-frequency signals may be simultaneously converted into digital signals.

Furthermore, unless signal linearity is guaranteed when the voltage of the detection signal is amplified using an additional program, the detection signal received from the detection coil may be immediately linearly amplified after the foregoing filtering procedure is omitted. In this case, since the procedure that cannot be performed due to the omission of the filtering procedure may be performed through a subsequent noise cancellation procedure, this does not cause a large problem in the overall process.

The noise cancellation unit 330 converts the digital signals into signals in a frequency domain, and eliminates signals falling out of the band of interest from the frequency domain.

The digital signals may be converted into the signals in the frequency domain using a Fast Fourier Transform (FFT) technique.

The term "frequency domain" is intended to represent digital signals that are output in a time domain based on frequencies, wherein the horizontal region (axis) of a graph may correspond to the frequency. Therefore, even if various frequencies have been detected due to noise, the frequencies in the band of interest and noise may be easily distinguished from each other, thus enabling signal analysis to be more precisely and easily performed.

Here, signals falling out of the band of interest may be eliminated from the digital signals using a digital element. At this time, since the signals have been converted in advance from analog signals into digital signals, a filter using a digital element may also be used as the filter for cancelling noise.

Similar to the case where an analog filter is used, signals falling out of the band of interest may be eliminated by causing the digital signals to pass through the digital filter.

The signal analysis unit 340 outputs the result values of signal analysis based on the frequency corresponding to the input signal and the frequency corresponding to the detection signal in the band of interest.

Here, the magnitude of the frequency corresponding to the detection signal and an input signal versus phase delay in the band of interest may be measured and output as the result values.

The result values output in this way are results corresponding to the FMMD technology, and may be utilized for analyzing the properties of the material corresponding to the measurement target sample.

Figure 4:
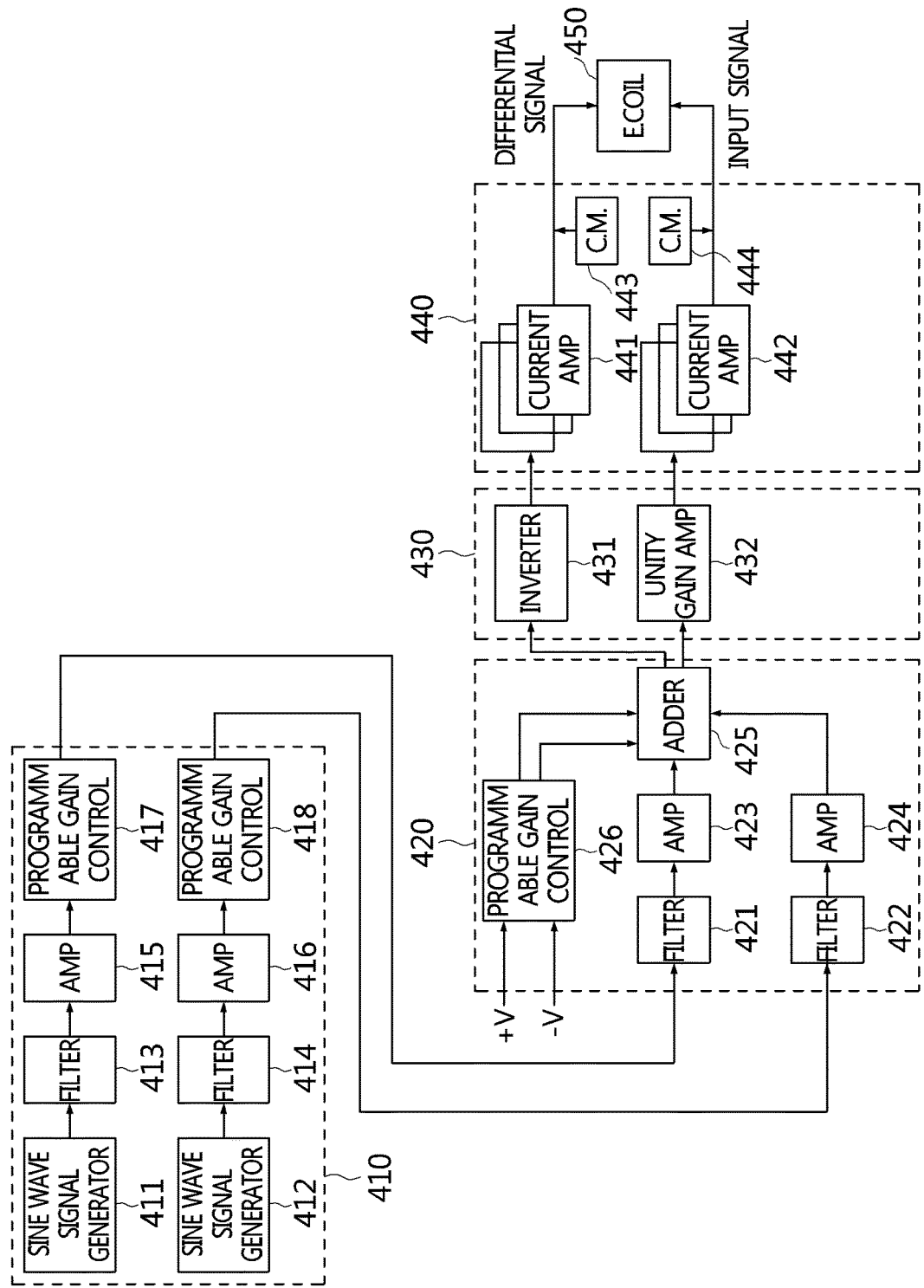
FIG. 4 is a block diagram illustrating in detail a signal transmission apparatus according to an embodiment of the present invention.

FIG. 4 is a block diagram illustrating in detail a signal transmission apparatus according to an embodiment of the present invention.

Referring to FIG. 4, the signal transmission apparatus according to the embodiment of the present invention includes a signal generation unit 410, a signal addition unit 420, a differential signal generation unit 430, and a signal transmission unit 440.

Here, the signal generation unit 410 may include sine wave signal generators 411 and 412, transmission filter units 413 and 414, power amplifiers (AMPs) 415 and 416, and transmission voltage control (programmable gain control) units 417 and 418.

The signal generation unit 410 may include the two sine wave signal generators 411 and 412 to generate two sine wave signals having different frequencies.

Here, the two sine wave signal generators 411 and 412 may generate a high-frequency sine wave signal and a low-frequency sine wave signal, respectively, and apply the respective sine wave signals to an excitation coil included in a magnetic particle measurement sensor.

Here, respective frequencies corresponding to the two sine wave signal generators 411 and 412 may be freely set by a user.

Each of the transmission filter units 413 and 414 may be provided with an analog element corresponding to at least one of active and passive elements, thus cancelling noise components from the two sine wave signals. That is, the noise components may be cancelled by causing the high-frequency sine wave signal and the low-frequency sine wave signal, which are respectively generated by the two sine wave signal generators 411 and 412, to pass through the transmission filter units 413 and 414, respectively.

Since the voltages of the two sine wave signals may decrease after the two sine wave signals have passed through the transmission filter units 413 and 414, the voltages of the two sine wave signals may be controlled to correspond to the values required by the excitation coil by providing the transmission voltage control units 417 and 418 for the respective signals subsequent to the transmission filter units.

Here, the transmission voltage control units 417 and 418 may amplify the voltages corresponding to the two sine wave signals by setting the values of the voltages to values required by the excitation coil using an additional program.

Further, the additional power AMPs 415 and 416 may be provided so as to amplify the signals in accordance with the setting characteristics of the transmission voltage control units 417 and 418, prior to controlling the values of the voltages using the transmission voltage control units 417 and 418.

For example, as shown in FIG. 4, the power AMPs 415 and 416 may be provided between the transmission filter units 413 and 414 and the transmission voltage control units 417 and 418, so that the signals to be input to the transmission voltage control units 417 and 418 may be amplified in accordance with the setting characteristics of the transmission voltage control units 417 and 418.

Furthermore, the signal addition unit 420 may include filters 421 and 422, power AMPs 423 and 424, an adder 425, and an offset signal control (programmable gain control) unit 426.

Here, the signal addition unit 420 may electronically add the two sine wave signals that have been received from the signal generation unit 410 after noise has been cancelled from the two sine wave signals, and may then generate an input signal for producing a magnetic field.

Here, the separate adder 425 may be provided so as to electronically add the two sine wave signals.

The two sine wave signals may be added and combined, and thus the combined signal may be generated without the two signals mutually influencing each other.

Here, the adder 425 may be a combiner for adding and combining two signals. For example, the combiner may correspond to any one of an RF combiner which corresponds to the characteristics of the input signal, an addition amplifier, and electronic equipment that enables an addition operation of analog signals. Here, which type of equipment is to be used may be selectively determined by a user and a manager who implement FMMD technology.

As shown in FIG. 4, before the signals are input to the adder 425, the two sine wave signals received from the signal generation unit 410 may pass through the respective filters 421 and 422 and the respective power AMPs 423 and 424.

Here, the filters 421 and 422 may function to cancel noise, similarly to the transmission filter units 413 and 414 of the signal generation unit 410, and the power AMPs 423 and 424 may also perform functions similar to those of the power AMPs 415 and 416 of the signal generation unit 410.

When each of the two sine wave signals is transmitted to a respective one excitation coil, the signal addition unit 420 may add only offset signals corresponding to the two sine wave signals, whereas when the sine wave signals are transmitted to a single excitation coil, the two sine wave signals may be added and combined.

Therefore, the signal addition unit 420 may also include the offset signal control unit 426, which is capable of controlling offset signals, that is, offset voltages, in preparation for the case where each of the two sine wave signals is transmitted to a respective one excitation coil.

Here, the offset signal control unit 426 may control the corresponding offset voltage by generating a positive (+) or negative (−) DC signal and adding the DC signal to the offset voltage.

Further, the differential signal generation unit 430 may include an inverter 431 and a power AMP (unity gain AMP) 432.

The differential signal generation unit 430 may generate a differential signal for minimizing transmission noise.

Here, the differential signal may mean a signal that is phase-inverted with respect to the input signal. During the transmission of the input signal, the differential signal is transmitted together with the input signal, thus enabling noise components occurring in respective signals to cancel each other out.

Therefore, the differential signal generation unit 430 may be provided with the inverter 431 for generating a signal that is phase-inverted with respect to the input signal.

Further, the differential signal generation unit 430 may be provided with the power AMP 432 for controlling the gain of the input signal depending on the circumstances, thus enabling the input signal to be controlled in accordance with the setting required by the excitation coil.

Furthermore, the signal transmission unit 440 may include parallel amplifiers 441 and 442 and current measuring units 443 and 444.

Here, the signal transmission unit 440 may amplify the voltages of the input signal and the differential signal and transmit the amplified signals to the excitation coil in order to produce a magnetic field in the excitation coil and apply the magnetic field to the measurement target sample.

Therefore, the signal transmission unit 440 may include the parallel amplifiers 441 and 442 for amplifying the input signal and the differential signal, respectively.

Here, although the parallel amplifiers 441 and 442 are illustrated in FIG. 4 as being provided so as to amplify the input signal and the differential signal, the input signal and the differential signal may be amplified using a single amplifier depending on the circumstances.

After respective current values of the input signal and the differential signal have been measured using the current measuring units 443 and 444, respectively, the transmission of signals may be controlled in consideration of the magnetic flux density of the excitation coil that is measured based on the current values.

In this way, if the transmission of the input signal and the differential signal has been determined based on the current values by the signal transmission unit 440, respective signals may be applied to an excitation coil 450 included in a magnetic particle measurement sensor, and thus a magnetic field may be produced on the measurement target sample.

Figure 5:
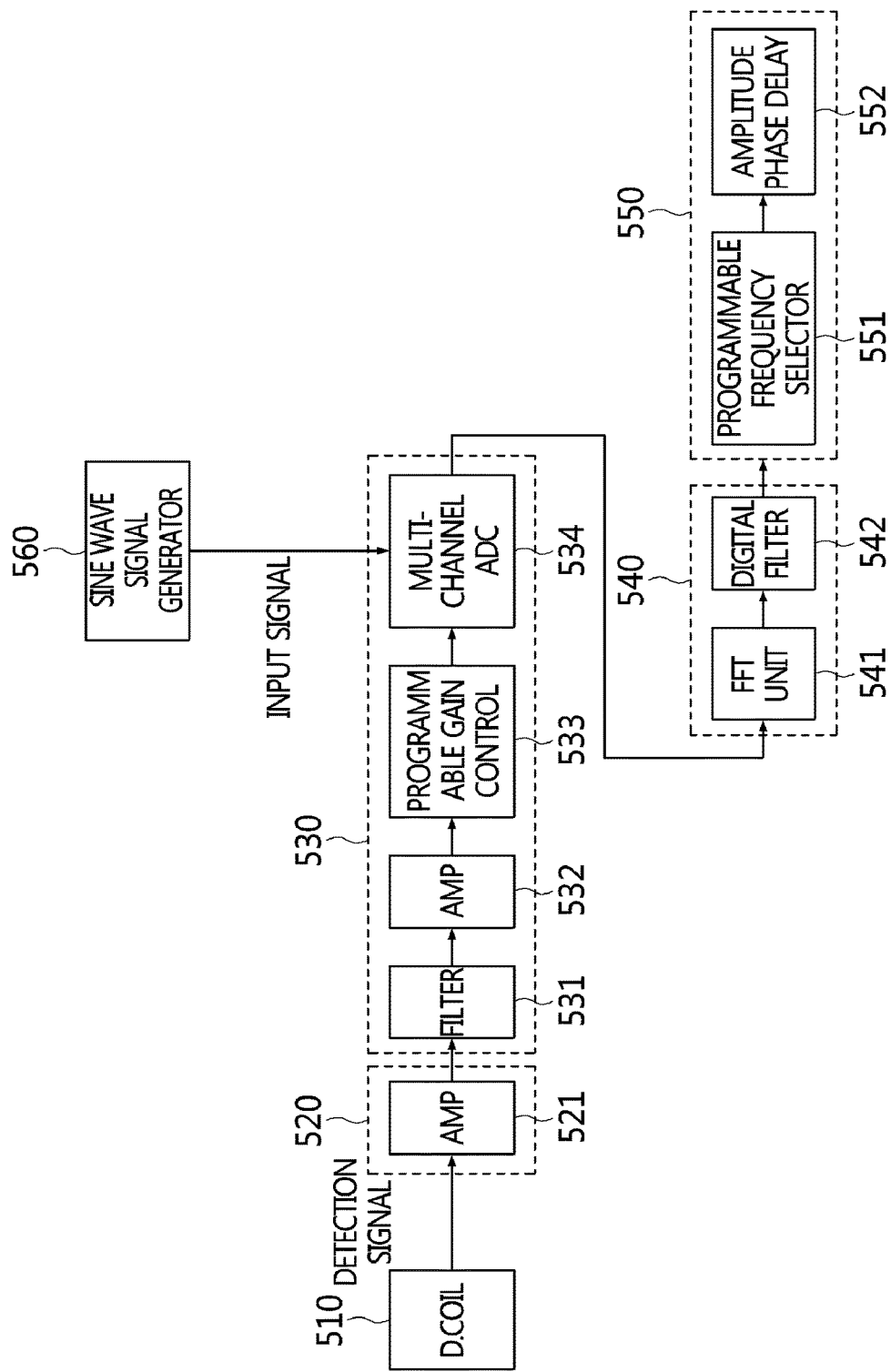
FIG. 5 is a block diagram illustrating in detail a signal reception apparatus according to an embodiment of the present invention.

FIG. 5 is a block diagram illustrating in detail a signal reception apparatus according to an embodiment of the present invention.

Referring to FIG. 5, the signal reception apparatus according to the embodiment of the present invention includes a signal reception unit 520, a signal conversion unit 530, a noise cancellation unit 540, and a signal analysis unit 550.

The signal reception unit 520 may include a power AMP 521.

The signal reception unit 520 may receive a detection signal, which is induced by a measurement target sample, from a detection coil 510 included in a magnetic particle measurement sensor.

Here, the detection signal may correspond to a signal in which the combined magnetic field produced by the magnetic particle measurement sensor is deformed by the measurement target sample and is input to the detection coil.

Here, the combined magnetic field may be produced by combining two magnetic fields respectively produced by two sine wave signals corresponding to the input signal.

Further, the signal reception unit 520 may be provided with the additional power AMP 521, and may amplify in advance the voltage of the detection signal that is input to a filter for cancelling the noise in the subsequent signal conversion unit 530.

Further, the signal conversion unit 530 may include a reception filter unit 531, a power AMP 532, a reception voltage control (programmable gain control) unit 533, and a multi-channel ADC 534.

Here, the signal conversion unit 530 may convert the input signal and the detection signal, which produce a magnetic field excited in the measurement target sample, into respective digital signals by time-synchronizing the input signal with the detection signal.

The signal conversion unit may control the voltage of the detection signal that is input to the multi-channel ADC 534 in accordance with the setting of the multi-channel ADC 534 while cancelling noise through the reception filter unit 531, the power AMP 532, and the reception voltage control unit 533.

Here, the reception filter unit 531 may be provided with an analog element corresponding to at least one of active and passive elements, thus cancelling noise. For example, noise may be cancelled by causing the detection signal to pass through the reception filter unit 531 that includes the analog element corresponding to at least one of active and passive elements.

Thereafter, the noise-cancelled (noise-free) detection signal may be amplified by passing through the power AMP 532, and then the amplified signal may be input to the reception voltage control unit 533.

Here, the reception voltage control unit 533 may linearly amplify the voltage of the detection signal to correspond to the input range of the multi-channel ADC 534 using an additional program. Here, since the detection signal from the detection coil 510 may be received at different signal intensities for respective materials corresponding to the measurement target sample, the gain of the detection signal may be controlled using the program of the reception voltage control unit 533.

In this case, the input signal may be received directly from a sine wave signal generator 560 for generating the input signal that is transmitted to the excitation coil of the magnetic particle measurement sensor, and a low-frequency signal and a high-frequency signal corresponding to the input signal may be converted into digital signals using the multi-channel ADC 534, simultaneously with the conversion of the detection signal. Here, low-frequency and high-frequency channels may be time-synchronized, and the low-frequency and high-frequency signals may be simultaneously converted into digital signals.

Here, unless the linearity of the detection signal is guaranteed when the voltage of the detection signal is controlled and amplified using the reception voltage control unit 533, the noise cancellation procedure performed in advance by the reception filter unit 531 may be omitted, and the detection signal received from the signal reception unit 520 may be immediately input to the reception voltage control unit 533. In this case, the procedure that cannot be performed due to the omission of the noise cancellation procedure that uses the filter 531 and the power AMP 532 may be performed by the subsequent noise cancellation unit 540, thereby not causing a large problem during the overall process.

Further, the noise cancellation unit 540 may include a Fast Fourier Transform (FFT) unit 541 and a digital filter 542.

Here, the noise cancellation unit 540 may convert the digital signals into signals in a frequency domain, and may eliminate signals falling out of a band of interest from the frequency domain.

The digital signals may be converted into the signals in the frequency domain using an FFT technique by the FFT unit 541.

Here, the term "frequency domain" is intended to indicate the digital signals that are output in a time domain, based on frequencies, wherein the horizontal region of a graph may correspond to frequency. Therefore, even if various frequencies have been detected due to noise, the frequencies in the band of interest and noise may be easily distinguished from each other, thus obtaining the advantage of more precisely and easily performing signal analysis.

Here, the digital filter 542 may eliminate signals falling out of the band of interest from the digital signals using a digital element. That is, since the detection signal has been converted in advance from an analog signal into the digital signal using the multi-channel ADC 534, a digital element may also be used for a filter for noise cancellation.

Further, the signal analysis unit 550 may include a band-of-interest frequency selector (programmable frequency selector) 551 and a phase delay (amplitude phase delay) measuring unit 552.

Here, the signal analysis unit 550 may output result values of signal analysis based on the frequency corresponding to the input signal and the frequency corresponding to the detection signal in the band of interest.

Here, only the frequencies falling within the range of interest may be selected from the frequency domain by the band-of-interest frequency selector 551.

Thereafter, the magnitude of the frequency corresponding to the detection signal and an input signal versus phase delay may be measured by the phase delay measuring unit 552 and may then be output as the result values.

Figure 6:
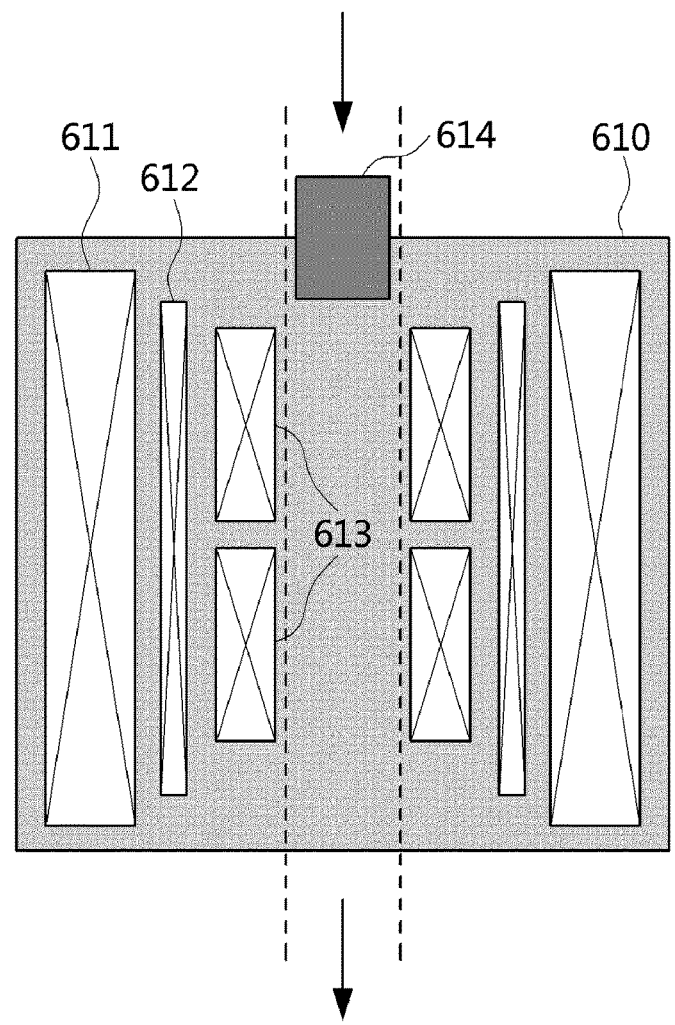
FIGS. 6 and 7 are diagrams illustrating examples of a magnetic particle measurement sensor according to the present invention.
Figure 7:
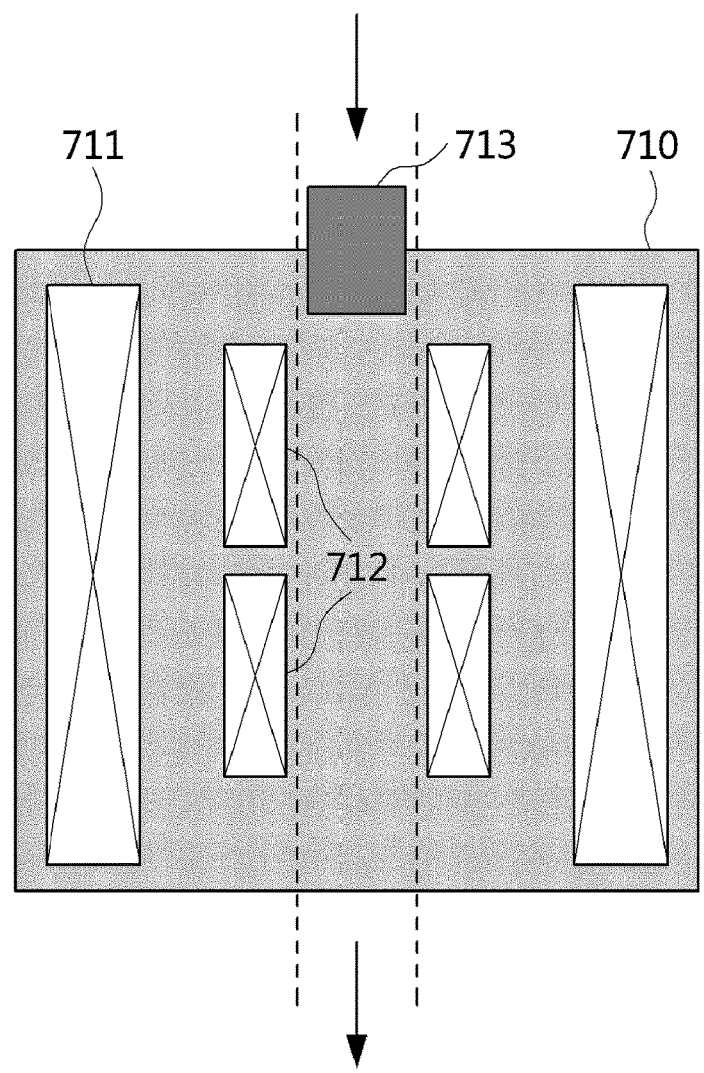

FIGS. 6 and 7 are diagrams illustrating examples of the magnetic particle measurement sensor according to the present invention.

Referring to FIGS. 6 and 7, the magnetic particle measurement sensor according to the present invention may be implemented in a form including two excitation coils 611 and 612, as shown in FIG. 6, or in a form including a single excitation coil 711, as shown in FIG. 7.

As shown in FIG. 6, a magnetic particle measurement sensor 610 including the two excitation coils 611 and 612 may receive input signals for respective excitation coils. That is, the two excitation coils 611 and 612 may produce respective magnetic fields.

Here, the two produced magnetic fields may be applied to a measurement target sample 614 in a combined form of the two magnetic fields.

Here, when a signal in which electrons in the combined magnetic field are induced is generated by the measurement target sample 614, the signal may be detected through a detection coil 613.

In order to determine whether a measurement material is contained in the measurement target sample 614, there is a need to apply a magnetic field mixed with a specific frequency. Therefore, the two excitation coils 611 and 612 must be able to be provided in the magnetic particle measurement sensor 610 through a calibration procedure for precisely adjusting a predetermined ratio, geometric locations, etc.

However, as shown in FIG. 7, a magnetic particle measurement sensor 710 including the single excitation coil 711 may produce a combined magnetic field by applying a previously combined input signal to the single excitation coil 711.

That is, since the previously combined input signal is applied, a calibration procedure may be omitted in the magnetic particle measurement sensor 710 having the configuration of FIG. 7, and thus the magnetic particle measurement sensor 710 may be more effective than the magnetic particle measurement sensor 610 shown in FIG. 6 from the standpoint of cost or accuracy.

Figure 8:
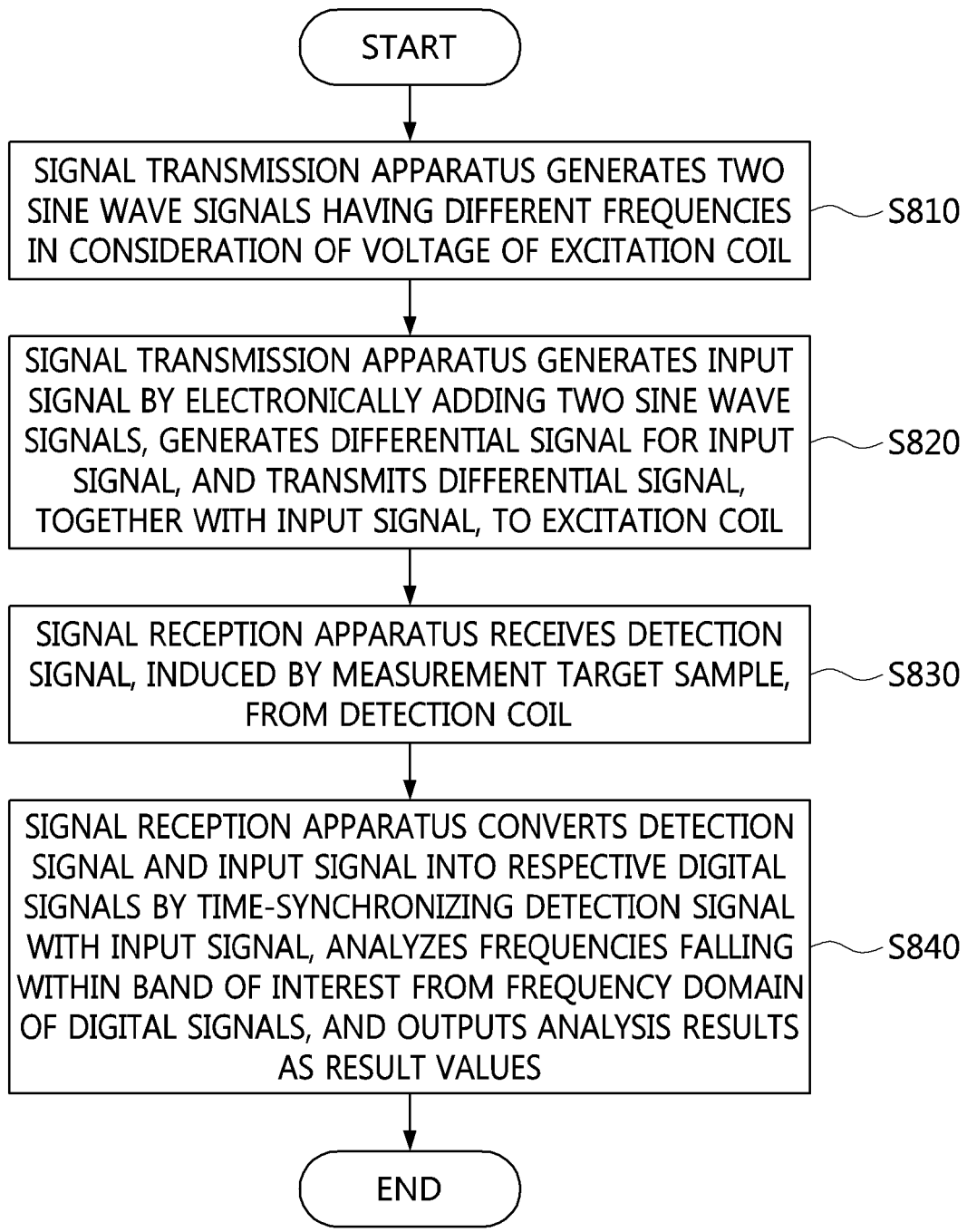
FIG. 8 is an operation flowchart illustrating a signal transmission/reception method for signal analysis in FMMD technology according to an embodiment of the present invention.

FIG. 8 is an operation flowchart illustrating a signal transmission/reception method for signal analysis in FMMD technology according to an embodiment of the present invention.

Referring to FIG. 8, in the signal transmission/reception method for signal analysis in FMMD technology according to an embodiment of the present invention, the signal transmission apparatus in a module for signal analysis in FMMD technology generates two sine wave signals having different frequencies in consideration of the voltage of an excitation coil included in a magnetic particle measurement sensor at step S810.

The two sine wave signals may be generated by a sine wave signal generator. Here, respective frequencies corresponding to the two sine wave signals may be selected by a user.

Here, the two sine wave signals may correspond to signals generated based on a fundamental frequency. Here, the fundamental frequency may be represented by a sine function, and may be a fundamental waveform used to represent spatial frequencies or sounds. Further, the two sine wave signals may correspond to one high-frequency signal and one low-frequency signal.

The noise in the two sine wave signals may be cancelled by an analog element corresponding to at least one of active and passive elements. For example, noise may be cancelled in such a way as to cause the signals generated by the sine wave signal generator to pass through a filter that includes the analog element corresponding to at least one of active and passive elements.

The voltages corresponding to the two sine wave signals, which have decreased due to the cancellation of noise, may be amplified to values required by the excitation coil.

In this case, the values of voltages corresponding to the two sine wave signals may be set to values required by the excitation coil using an additional program, and thus the voltage values may be amplified to the set values.

An additional amplifier is provided previous to an amplifier for controlling the values of voltages using the additional program, so that signals may be amplified and then input in accordance with the setting characteristics of the amplifier that enables the setting of gain through the program.

For example, assuming that an amplifier for controlling the values of voltages using the additional program is a first amplifier, a second amplifier is additionally provided between a filter for cancelling noise and the first amplifier, so that signals to be input to the first amplifier may be amplified in accordance with the setting characteristics of the first amplifier.

Further, in the signal transmission/reception method for signal analysis in FMMD technology according to the embodiment of the present invention, the signal transmission apparatus generates an input signal for producing a magnetic field in the excitation coil by electronically adding the two sine wave signals, generates a differential signal for the input signal, and transmits the differential signal together with the input signal to the excitation coil at step S820.

In an example, when two excitation coils are used, magnetic fields are produced by respective excitation coils, but a procedure for calibrating the two excitation coils may be included so as to produce a combined magnetic field suitable for the measurement of magnetic particles.

In another example, when a single excitation coil is used, two signals are combined in advance and the combined signal is excited in the excitation coil, thus enabling a magnetic field to be produced by the combined signal in the single excitation coil. That is, in this case, there is an advantage in that the expense for a single excitation coil and expense for calibration are reduced.

Here, when each of the two sine wave signals is transmitted to a respective one excitation coil, the input signal may be generated by adding only offset signals corresponding to the two sine wave signals.

Here, "offset signal" may mean an offset voltage, which may correspond to a voltage to be applied to an input terminal so that an output is adjusted to zero when the output occurs even if the signal of an input circuit is zero.

That is, when each of the two sine wave signals is transmitted to a respective one excitation coil, offset voltages corresponding to the two sine wave signals may be added and may be applied to an input signal generated by the two sine wave signals.

Further, when the two sine wave signals are transmitted to a single excitation coil, the input signal may be generated by adding and combining the two sine wave signals.

Here, the two sine wave signals may be added and combined using a combiner that adds and combines two signals. That is, the combiner may be a passive electronic element for adding and combining two signals.

For example, the combiner may correspond to any one of an RF combiner, which corresponds to the characteristics of the input signal, an addition amplifier, and electronic equipment that enables an addition operation of analog signals. Here, which type of equipment is to be used may be selectively determined by a user and a manager who implement FMMD technology.

Here, the combiner may be a concept including not only existing electronic equipment such as an RF combiner or an addition amplifier, which is conventionally used, but also electronic equipment that can be developed in the future and enables an addition operation of analog signals.

Here, the two sine wave signals may be added and combined, and thus the two signals may be combined without mutually influencing each other.

The procedure for adding and combining two sine wave signals may be performed such that the signals are combined in conformity with a ratio adjusted by the foregoing amplifier that controls the values of voltages using an additional program.

Here, the differential signal may mean a signal that is phase-inverted with respect to the input signal. Here, during signal transmission, noise occurring in the input signal and noise occurring in the differential signal cancel each other out, and thus signal deformation attributable to noise may be minimized after the input signal has been transmitted.

Here, respective current values of the input signal and the differential signal may be measured, and the transmission of the input signal and the differential signal may be controlled in consideration of the magnetic flux density of the excitation coil measured based on the current values.

Since the internal or external magnetic flux density of the excitation coil may be implemented by the product of current and magnetic flux per unit current, a procedure for measuring the current values may be essentially required to suitably control the magnetic flux density.

In particular, the relationship between the current, the impedance of the excitation coil, and the ultimate output voltage may follow Ohm's law, and the magnetic flux per current may be related only to the geometry of the excitation coil. Therefore, it is more convenient to separately control the current and the magnetic flux per current in order to control the magnetic flux density of the excitation coil.

The voltages of the input signal and the differential signal may be amplified using at least one of a single amplifier and a parallel amplifier.

Here, if it is determined that the supply of current to the single amplifier is not desirably performed based on a current value, the voltages may be amplified using the parallel amplifier.

For example, voltage-amplified signals may be primarily transmitted using the single amplifier, and the voltages may be secondarily amplified using the parallel amplifier in which power amplifiers are inserted in parallel, depending on the results of measurement of the current value.

Next, in the signal transmission/reception method for signal analysis in FMMD technology according to the embodiment of the present invention, the signal reception apparatus receives a detection signal, which is induced by the measurement target sample, from a detection coil included in the magnetic particle measurement sensor at step S830.

Here, the detection signal may be a signal in which the combined magnetic field produced by the magnetic particle measurement sensor is deformed by the measurement target sample and is input to the detection coil.

The combined magnetic field may be produced in such a way that two respective magnetic fields produced by the two sine wave signals corresponding to the input signal are combined.

Here, the noise in the detection signal may be cancelled using an analog element corresponding to at least one of active and passive elements. For example, noise may be cancelled by causing the detection signal to pass through a filter that includes the analog element corresponding to at least one of active and passive elements.

Here, only the signal falling within a band of interest may be maintained by cancelling noise from the detection signal.

The intensity of the detection signal may be linearly amplified using an additional amplifier before the detection signal, received from the detection coil, passes through the filter, depending on the intensity of the detection signal input to the filter or the setting of the filter.

Here, the voltage of the detection signal may be linearly amplified to correspond to the input range of an ADC using an additional program. Since the detection signal from the detection coil may be received at different signal intensities for respective materials corresponding to the measurement target sample, the gain of the detection signal may be controlled by the amplifier that uses the program.

In this case, an additional amplifier is provided previous to an amplifier for controlling the values of voltages using the additional program, so that signals may be amplified and then input in accordance with the setting characteristics of the amplifier that enables the setting of gain through the program.

For example, assuming that an amplifier for controlling the values of voltages using the additional program is a first amplifier, a second amplifier is additionally provided between a filter for cancelling noise and the first amplifier, so that signals to be input to the first amplifier may be amplified in accordance with the setting characteristics of the first amplifier.

Furthermore, unless signal linearity is guaranteed when the voltage of the detection signal is amplified using an additional program, the detection signal received from the detection coil may be immediately linearly amplified after the foregoing filtering procedure is omitted. In this case, since the procedure that cannot be performed due to the omission of the filtering procedure may be performed through a subsequent noise cancellation procedure, this does not cause a large problem in the overall process.

Then, in the signal transmission/reception method for signal analysis in FMMD technology according to the embodiment of the present invention, the signal reception apparatus converts the detection signal and the input signal into respective digital signals by time-synchronizing the detection signal with the input signal, analyzes frequencies falling within a band of interest from the frequency domain of the digital signals, and outputs the analysis results as result values at step S840.

Here, the input signal may be received from a sine wave signal generator that transmits a signal to the excitation coil of the magnetic particle measurement sensor, and a low-frequency signal and a high-frequency signal corresponding to the input signal may be converted into digital signals using a multi-channel ADC, simultaneously with the conversion of the detection signal. Here, low-frequency and high-frequency channels may be time-synchronized, and the low-frequency and high-frequency signals may be simultaneously converted into digital signals.

Here, a low-frequency signal and a high-frequency signal corresponding to the input signal may be converted into digital signals, simultaneously with the conversion of the detection signal, using a multi-channel ADC.

The digital signals may be converted into the signals in the frequency domain using a Fast Fourier Transform (FFT) technique.

The term "frequency domain" is intended to represent digital signals that are output in a time domain based on frequencies, wherein the horizontal region (axis) of a graph may correspond to the frequency. Therefore, even if various frequencies have been detected due to noise, the frequencies in the band of interest and noise may be easily distinguished from each other, thus enabling signal analysis to be more precisely and easily performed.

Here, signals falling out of the band of interest may be eliminated from the digital signals using a digital element. At this time, since the signals have been converted in advance from analog signals into digital signals, a filter using a digital element may also be used as the filter for cancelling noise.

Similar to the case where an analog filter is used, signals falling out of the band of interest may be eliminated by causing the digital signals to pass through the digital filter.

Here, the magnitude of the frequency corresponding to the detection signal and an input signal versus phase delay in the band of interest may be measured and output as the result values.

The result values output in this way are results corresponding to the FMMD technology, and may be utilized for analyzing the properties of the material corresponding to the measurement target sample.

In accordance with the present invention, a wide variety of types of materials may be measured when FMMD for measuring the nonlinear degree of a nonlinear material located in an applied magnetic field is implemented.

Further, the present invention may enable the provision of a high SNR and the analysis of various frequency bands to be simultaneously performed, compared to an analog lock-in method, through digital signal processing configuration when FMMD for measuring the nonlinear degree of a nonlinear material located in an applied magnetic field is implemented.

As described above, in the signal transmission/reception method for signal analysis in FMMD technology and the apparatus using the method according to the present invention, the configurations and schemes in the above-described embodiments are not limitedly applied, and some or all of the above embodiments can be selectively combined and configured such that various modifications are possible.

What is claimed is:

1. A signal transmission apparatus in a module for signal analysis in Frequency Mixing Magnetic Detection (FMMD) technology, comprising:
    a signal generation unit for generating two sine wave signals having different frequencies based on a voltage of an excitation coil included in a magnetic particle measurement sensor;
    a signal addition unit for generating an input signal for producing a magnetic field by electronically adding the two sine wave signals;
    a differential signal generation unit for generating a differential signal for the input signal to minimize transmission noise; and
    a signal transmission unit for amplifying voltages of the input signal and the differential signal and transmitting the amplified input signal and differential signal to the excitation coil so as to produce a magnetic field in the excitation coil and apply the magnetic field to a measurement target sample.

2. The signal transmission apparatus of claim 1, wherein the signal addition unit is configured to, when each of the two sine wave signals is transmitted to a respective one excitation coil, add only offset signals corresponding to the two sine wave signals, and when the two sine wave signals are transmitted to a single excitation coil, add and combine the two sine wave signals.

3. The signal transmission apparatus of claim 1, wherein the signal transmission unit measures respective current values of the input signal and the differential signal, and controls transmission of the input signal and the differential signal based on a magnetic flux density of the excitation coil, which is measured based on the current values.

4. The signal transmission apparatus of claim 3, wherein the signal transmission unit amplifies voltages of the input signal and the differential signal using at least one of a single amplifier and a parallel amplifier.

5. The signal transmission apparatus of claim 1, wherein the signal generation unit comprises:
    a filter unit for cancelling noise from the two sine wave signals using an analog element corresponding to at least one of active and passive elements; and
    a voltage control unit for amplifying voltages corresponding to the two sine wave signals, which have decreased due to cancellation of noise, to values required by the excitation coil.

6. The signal transmission apparatus of claim 5, wherein the voltage control unit amplifies the voltages corresponding to the two sine wave signals by setting values of the voltages to the values required by the excitation coil using an additional program.

7. The signal transmission apparatus of claim 2, further comprising an offset signal control unit for controlling the offset signals.

8. A signal reception apparatus in a module for signal analysis in Frequency Mixing Magnetic Detection (FMMD) technology, comprising:
    a signal reception unit for receiving a detection signal, induced by a measurement target sample, from a detection coil included in a magnetic particle measurement sensor;
    a signal conversion unit for converting an input signal and the detection signal that produce a magnetic field excited in the measurement target sample into respective digital signals by time-synchronizing the input signal with the detection signal;
    a noise cancellation unit for converting the digital signals into signals in a frequency domain and eliminating signals falling out of a band of interest from the frequency domain; and
    a signal analysis unit for outputting result values of signal analysis based on a frequency corresponding to the input signal and a frequency corresponding to the detection signal in the band of interest.

9. The signal reception apparatus of claim 8, wherein the signal conversion unit comprises:
    a filter unit for cancelling noise from the detection signal using an analog element corresponding to at least one of active and passive elements; and
    a voltage control unit for linearly amplifying a voltage of the detection signal to correspond to an input range of an Analog-to-Digital Converter (ADC) using an additional program.

10. The signal reception apparatus of claim 9, wherein the signal conversion unit is configured to receive the input signal from a sine wave signal generator, which transmits a signal to an excitation coil of the magnetic particle measurement sensor, and to convert a low-frequency signal and a high-frequency signal corresponding to the input signal into digital signals, simultaneously with conversion of the detection signal, using a multi-channel ADC.

11. The signal reception apparatus of claim 8, wherein the noise cancellation unit converts the digital signals into signals in a frequency domain using a Fast Fourier Transform (FFT) technique.

12. The signal reception apparatus of claim 11, wherein the noise cancellation unit eliminates signals falling out of the band of interest from the digital signals using a digital element.

13. The signal reception apparatus of claim 8, wherein the signal analysis unit measures a magnitude of the frequency corresponding to the detection signal and an input signal versus phase delay in the band of interest, and outputs the frequency magnitude and the input signal versus phase delay as the result values.

14. A signal transmission/reception method for signal analysis in Frequency Mixing Magnetic Detection (FMMD) technology, the method being performed by a module for signal analysis in FMMD technology, the method comprising:

generating, by a signal transmission apparatus, two sine wave signals having different frequencies based on a voltage of an excitation coil included in a magnetic particle measurement sensor;

generating, by the signal transmission apparatus, an input signal for producing a magnetic field in the excitation coil by electronically adding the two sine wave signals, generating a differential signal for the input signal, and transmitting the differential signal, together with the input signal, to the excitation coil;

receiving, by a signal reception apparatus, a detection signal, induced by a measurement target sample, from a detection coil included in the magnetic particle measurement sensor; and converting, by the signal reception apparatus, the detection signal and the input signal into respective digital signals by time-synchronizing the detection signal with the input signal, analyzing frequencies falling within a band of interest from a frequency domain of the digital signals, and outputting analysis results as result values.

15. The signal transmission/reception method of claim 14, wherein transmitting the differential signal together with the input signal comprises:

when each of the two sine wave signals is transmitted to a respective one excitation coil, generating the input signal by adding only offset signals corresponding to the two sine wave signals; and when the two sine wave signals are transmitted to a single excitation coil, generating the input signal by adding and combining the two sine wave signals.

16. The signal transmission/reception method of claim 14, wherein transmitting the differential signal together with the input signal is configured to measure respective current values of the input signal and the differential signal and to control transmission of the input signal and the differential signal based on a magnetic flux density of the excitation coil, which is measured based on the current values.

17. The signal transmission/reception method of claim 16, wherein transmitting the differential signal together with the input signal comprises amplifying voltages of the input signal and the differential signal using at least one of a single amplifier and a parallel amplifier.

18. The signal transmission/reception method of claim 14, wherein receiving the detection signal comprises:

cancelling noise from the detection signal using an analog element corresponding to at least one of the active and passive elements; and linearly amplifying a voltage of the detection signal to correspond to an input range of an Analog-to-Digital Converter (ADC) using an additional program.

19. The signal transmission/reception method of claim 14, wherein outputting the analysis results as the result values comprises:

receiving the input signal from a sine wave signal generator; and converting a low-frequency signal and a high-frequency signal corresponding to the input signal into digital signals, simultaneously with conversion of the detection signal, using a multi-channel ADC.

20. The signal transmission/reception method of claim 19, wherein converting the low-frequency signal and the high-frequency signal comprises:

converting the digital signals into signals in a frequency domain using a Fast Fourier Transform (FFT) technique; and eliminating signals falling out of the band of interest from the digital signals using a digital element.

* * * * *